US012777676B2

(12) United States Patent
Mori

(10) Patent No.: US 12,777,676 B2
(45) Date of Patent: Oct. 27, 2026

(54) SEMICONDUCTOR DEVICE AND METHOD OF MANUFACTURING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Yuichi Mori, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 480 days.

(21) Appl. No.: 18/472,312

(22) Filed: Sep. 22, 2023

(65) Prior Publication Data

US 2024/0128371 A1 Apr. 18, 2024

(30) Foreign Application Priority Data

Oct. 13, 2022 (JP) ................................ 2022-164543

(51) Int. Cl.
*H10D 30/66* (2025.01)
*H10D 30/01* (2025.01)
(Continued)

(52) U.S. Cl.
CPC ....... *H10D 30/668* (2025.01); *H10D 30/0297* (2025.01); *H10D 62/126* (2025.01); *H10D 64/513* (2025.01)

(58) Field of Classification Search
CPC ............ H10D 30/668; H10D 30/0297; H10D 62/126; H10D 64/513; H10D 62/127
See application file for complete search history.

(56) References Cited

U.S. PATENT DOCUMENTS 5,168,331 A * 12/1992 Yilmaz .............. H10D 30/0297 257/E29.066
6,005,271 A * 12/1999 Hshieh ................ H10D 64/519 257/341
(Continued)

FOREIGN PATENT DOCUMENTS

JP 2005-019741 A 1/2005
JP 2012-004473 A 1/2012
(Continued)

OTHER PUBLICATIONS

Kato, T. et al., "Enhanced performance of 50nm Ultra-Narrow-Body Silicon Carbide MOSFETs based on FinFET effect", ISPSD, Sep. 2020, pp. 110-113.
(Continued)

*Primary Examiner* — Mohsen Ahmadi
(74) *Attorney, Agent, or Firm* — Posz Law Group, PLC

(57) ABSTRACT

A semiconductor device includes: a semiconductor substrate having a first main surface and a second main surface, in which a first semiconductor region, a second semiconductor region, and a third semiconductor region are arranged in this order in a thickness direction of the semiconductor substrate. The third semiconductor region is exposed from the first main surface. Trench gates are extended from the first main surface to reach the first semiconductor region beyond the third semiconductor region and the second semiconductor region. The trench gates are spaced from each other in a first direction. A part of the semiconductor substrate located between the trench gates adjacent to each other in the first direction includes a trunk portion extending along a second direction orthogonal to the first direction and a branch portion protruding from the trunk portion.

17 Claims, 9 Drawing Sheets

(51) Int. Cl.
*H10D 62/10* (2025.01)
*H10D 64/27* (2025.01)

(56) References Cited

U.S. PATENT DOCUMENTS

| | | | | |
|---|---|---|---|---|
| 12,538,470 | B2 * | 1/2026 | Ma | H10B 12/30 |
| 2005/0006700 | A1 * | 1/2005 | Cao | H10D 30/668 257/E29.136 |
| 2007/0040213 | A1 * | 2/2007 | Hotta | H10D 12/481 257/E29.066 |
| 2008/0157192 | A1 * | 7/2008 | Pang | H10D 30/0297 257/334 |
| 2009/0072304 | A1 * | 3/2009 | Adan | H10D 64/519 257/E29.264 |
| 2013/0277734 | A1 * | 10/2013 | Nishiguchi | H10D 30/0297 438/270 |
| 2017/0069714 | A1 | 3/2017 | Tsuchitani et al. | |
| 2018/0240906 | A1 * | 8/2018 | Tsujimura | H10D 30/668 |
| 2019/0189800 | A1 * | 6/2019 | Orita | H10D 62/157 |
| 2020/0135939 | A1 | 4/2020 | Shibata | |
| 2021/0083097 | A1 * | 3/2021 | Gangi | H10D 62/127 |
| 2023/0078116 | A1 * | 3/2023 | Kobayashi | H10D 30/668 257/331 |
| 2024/0096957 | A1 * | 3/2024 | Kondo | H10D 30/668 |

FOREIGN PATENT DOCUMENTS

| | | | |
|---|---|---|---|
| JP | 2013-251396 | A | 12/2013 |
| JP | 2015-130393 | A | 7/2015 |
| JP | 2020-126932 | A | 8/2020 |

OTHER PUBLICATIONS

Kato, T. et al., "Enhanced Performance of 50 nm Ultra Narrow Body SiliconCarbide MOSFETs based on FinFET effect", Proceedings of the 7th Mettingon Advanced Power Semiconductors, 2020, pp. 121-122.

Udrea, F. et al., "The FinFET effect in Silicon Carbide MOSFETs", ISPSD, May-Jun. 2021, pp. 75-78.

Omura, Y. et al., "Quantum-Mechanical Effects on the Threshold Voltage of Ultrathin-SO1 nMOSFET's", IEEE Electron Device Letters, Dec. 1993, vol. 14, No. 12, pp. 569-571.

* cited by examiner

SEMICONDUCTOR DEVICE AND METHOD OF MANUFACTURING THE SAME

CROSS REFERENCE TO RELATED APPLICATION

This application is based on Japanese Patent Application No. 2022-164543 filed on Oct. 13, 2022, the disclosure of which is incorporated herein by reference.

TECHNICAL FIELD

The present disclosure relates to a semiconductor device having trench gates and a method of manufacturing the semiconductor device.

BACKGROUND

A semiconductor device such as MOSFET or IGBT has trench gates. The semiconductor device is manufactured by forming trenches on one main surface of a semiconductor substrate and then forming a trench gate in each of the trenches.

SUMMARY

A semiconductor device includes a semiconductor substrate and trench gates. The semiconductor substrate has a first main surface and a second main surface. A first semiconductor region having a first conductivity type, a second semiconductor region having a second conductivity type, and a third semiconductor region having a first conductivity type are arranged in this order in a thickness direction of the semiconductor substrate. The third semiconductor region is provided at a position exposed from the first main surface. The trench gates are extended from the first main surface of the semiconductor substrate to reach the first semiconductor region beyond the third semiconductor region and the second semiconductor region. The trench gates are spaced from each other in a first direction when the semiconductor substrate is viewed in a plan view. A part of the semiconductor substrate located between the trench gates adjacent to each other in the first direction includes a trunk portion extending in a second direction orthogonal to the first direction and a branch portion protruding from the trunk portion when the semiconductor substrate is viewed in a plan view.

DETAILED DESCRIPTION

Figure 1:
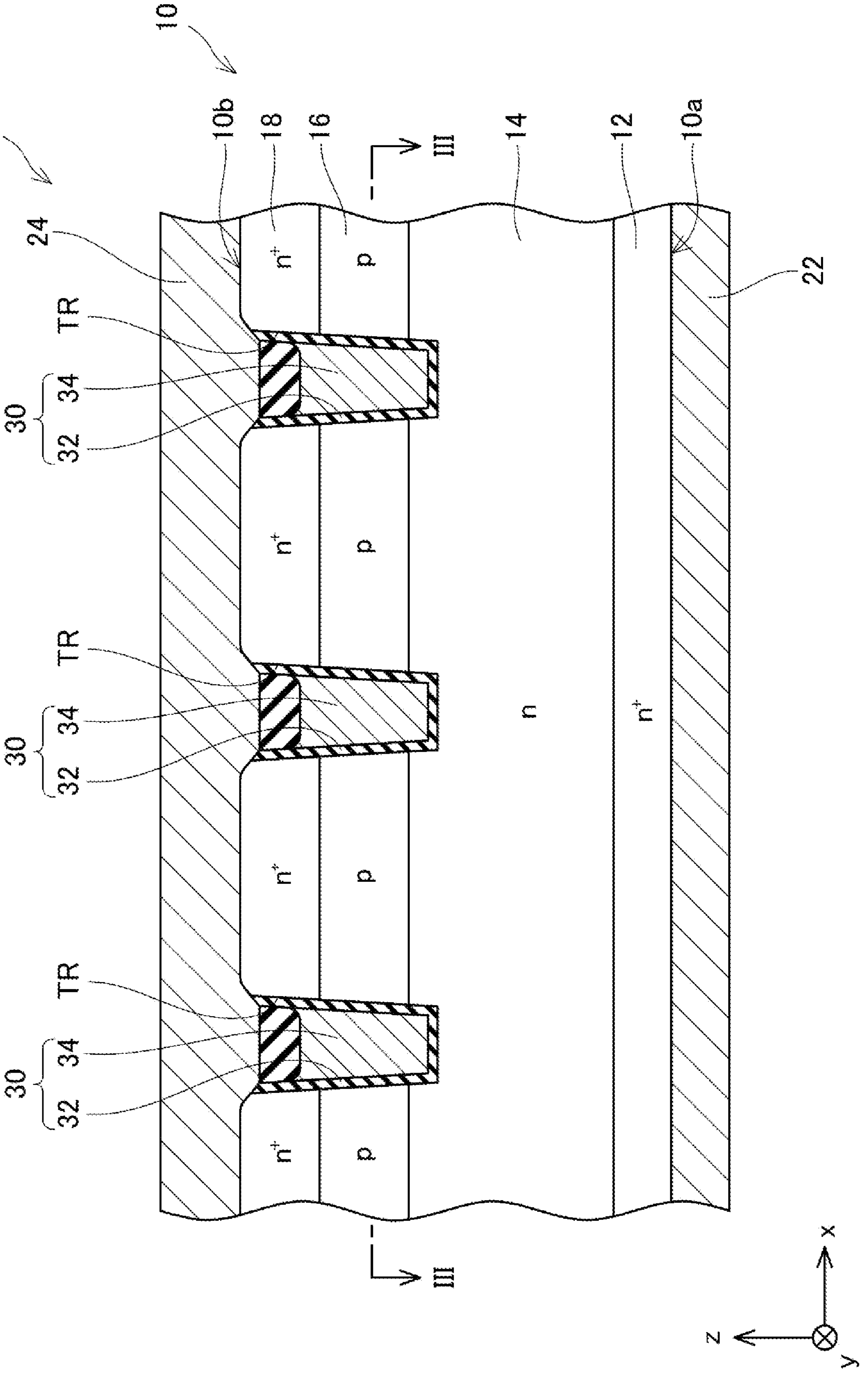
FIG. 1 is a sectional view illustrating a semiconductor device according to an embodiment, taken along line I-I in FIG. 3.

A semiconductor device such as MOSFET or IGBT has trench gates. The semiconductor device is manufactured by forming trenches on one main surface of a semiconductor substrate and then forming a trench gate in each of the trenches. In a semiconductor device having trench gates, it is desired to increase the area of channel by shortening a distance between adjacent trench gates in order to reduce on-resistance. In order to shorten the distance between adjacent trench gates, when forming the trenches, one main surface of the semiconductor substrate needs to be processed so that the distance between adjacent trenches is shortened. At this time, a part of the semiconductor substrate remaining between the adjacent trenches is processed into a thin plate shape. For this reason, there is a concern about pattern collapse at a part of the thin semiconductor substrate. If the distance between adjacent trench gates is shortened so that the entire space between the adjacent trench gates becomes a channel, the issue of pattern collapse is to be solved. In a semiconductor device having trench gates, a technique for suppressing pattern collapse during such a manufacturing process is required.

A semiconductor device includes a semiconductor substrate and trench gates. The semiconductor substrate has a first main surface and a second main surface. A first semiconductor region having a first conductivity type, a second semiconductor region having a second conductivity type, and a third semiconductor region having a first conductivity type are arranged in this order along a thickness direction of the semiconductor substrate. The third semiconductor region is provided at a position exposed from the first main surface. The trench gates are extended from the first main surface of the semiconductor substrate to reach the first semiconductor region beyond the third semiconductor region and the second semiconductor region. The trench gates are spaced apart from each other along a first direction when the semiconductor substrate is viewed in a plan view. A part of the semiconductor substrate located between the trench gates adjacent to each other in the first direction includes a trunk portion extending along a second direction orthogonal to the first direction and a branch portion protruding from the trunk portion when the semiconductor substrate is viewed in a plan view.

In the semiconductor device, a part of the semiconductor substrate between adjacent trench gates may be configured by the trunk portion and the branch portion. The branch portion is formed to protrude from a side surface of the trunk portion having a thin plate shape. Thus, the branch portion can support the trunk portion. As described above, the semiconductor device has a structure capable of suppressing pattern collapse during a manufacturing process.

A method of manufacturing a semiconductor device includes: forming a plurality of trenches on a first main surface of a semiconductor substrate; and forming a trench gate in each of the plurality of trenches. A first semiconductor region having a first conductivity type, a second semiconductor region having a second conductivity type, and a third semiconductor region having a first conductivity type are arranged in this order along a thickness direction of the semiconductor substrate. The third semiconductor region is provided at a position exposed from the first main surface. Each of the trenches is formed to reach the first semiconductor region from the first main surface of the semiconductor substrate beyond the third semiconductor region and the second semiconductor region. The trench gates are arranged to be spaced apart from each other along a first direction when the semiconductor substrate is viewed in a plan view. A part of the semiconductor substrate between the trench gates adjacent to each other in the first direction includes a trunk portion extending along a second direction orthogonal to the first direction and a branch portion protruding from the trunk portion when the semiconductor substrate is viewed in a plan view.

In the semiconductor device manufactured by the above manufacturing method, a part of the semiconductor substrate between adjacent trench gates is configured by the trunk portion and the branch portion. The branch portion is formed to protrude from a side surface of the trunk portion having a thin plate shape. Thus, the branch portion can support the trunk portion. As described above, in the method of manufacturing a semiconductor device, when trenches are formed in the trench forming step, pattern collapse is suppressed in a part of the semiconductor substrate between adjacent trenches.

Figure 2:
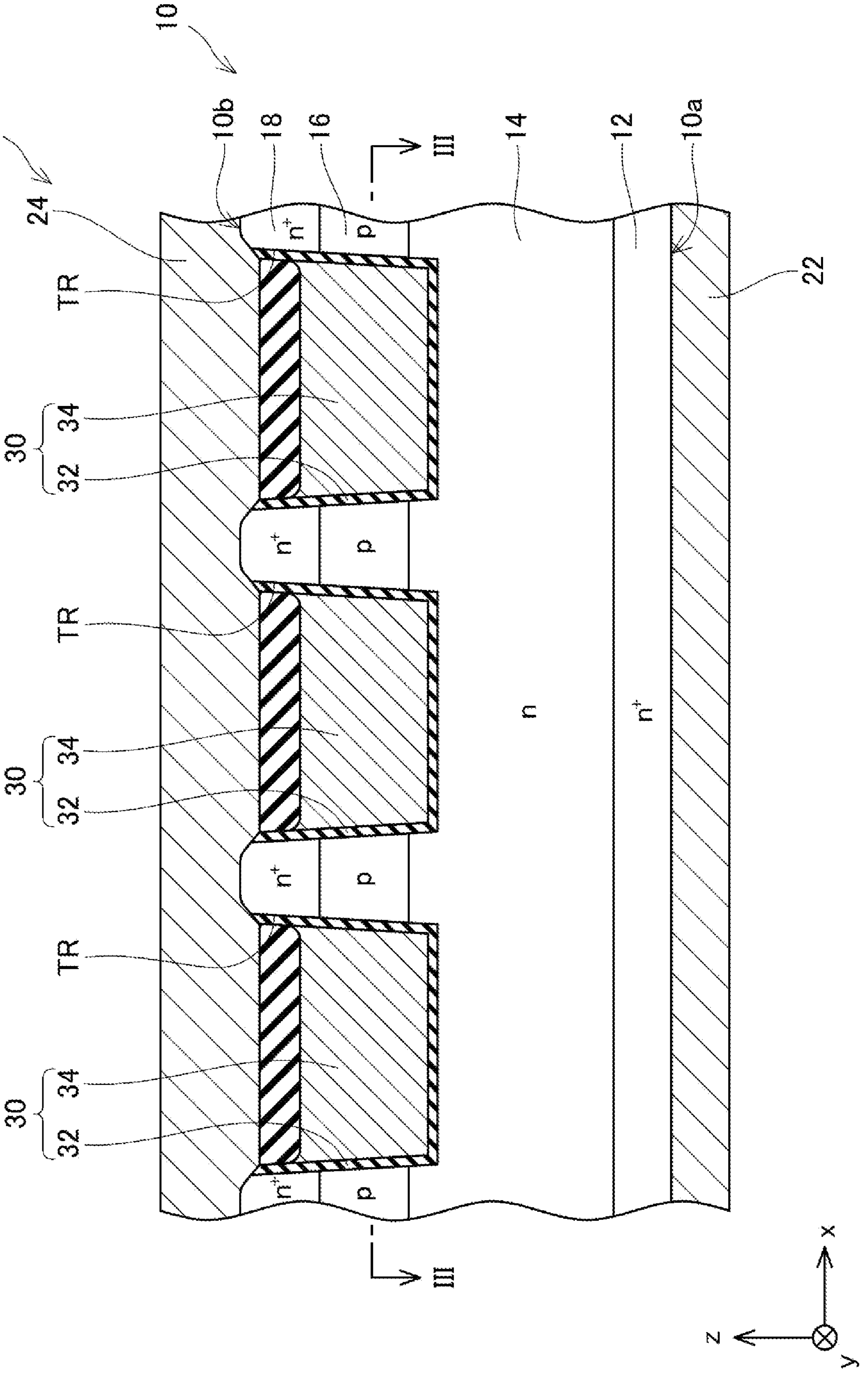
FIG. 2 is a sectional view illustrating the semiconductor device of the embodiment, taken along line II-II in FIG. 3.
Figure 3:
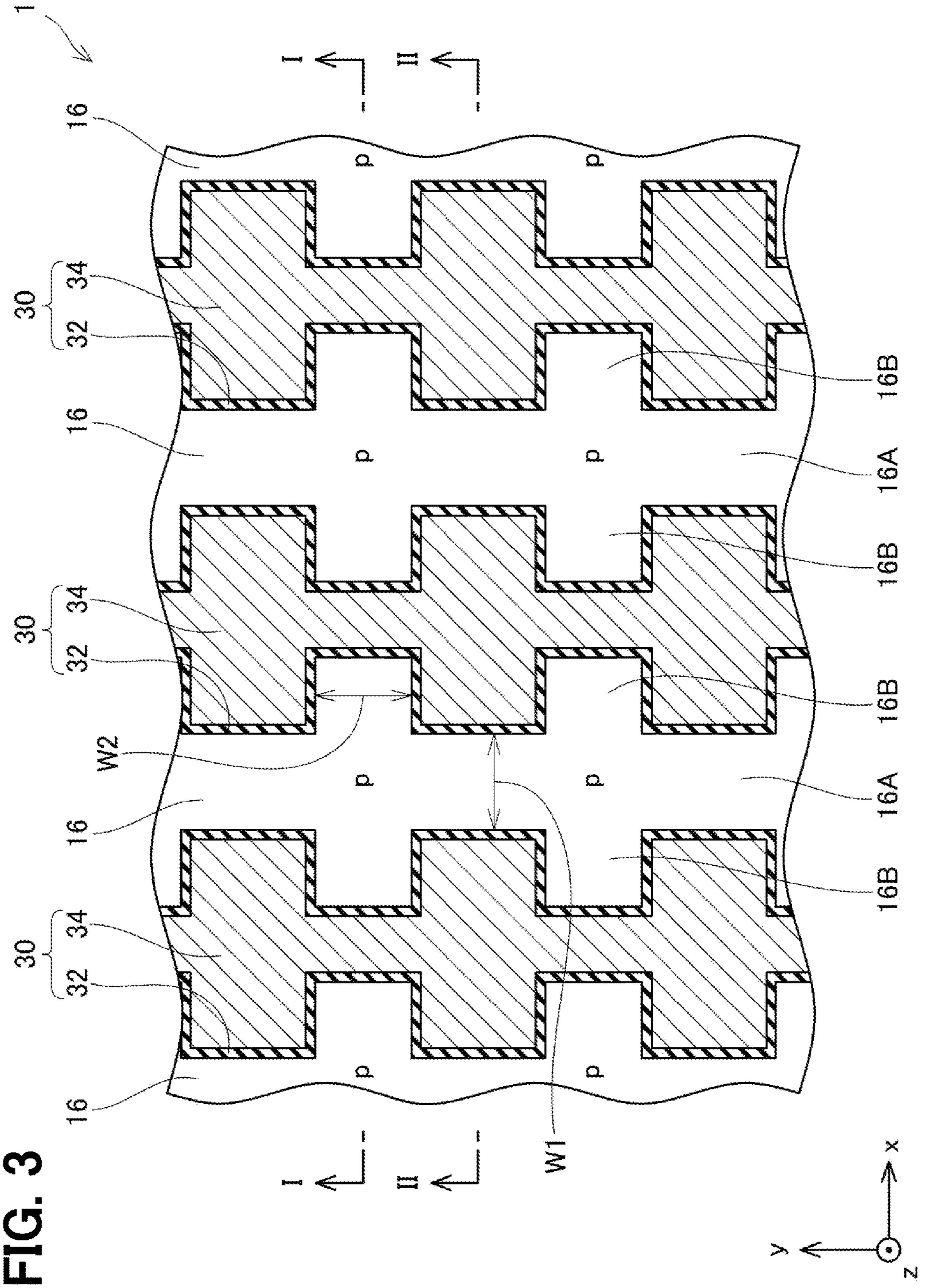
FIG. 3 is a sectional view illustrating the semiconductor device of the embodiment, taken along line III-Ill in FIG. 1 and FIG. 2.

As shown in FIGS. 1 to 3, a semiconductor device 1 is a power device such as a MOSFET (metal-oxide-semiconductor field effect transistor), and includes a semiconductor substrate 10. The semiconductor substrate 10 is not particularly limited, but may be, for example, silicon carbide (SiC). Instead of this example, the semiconductor substrate 10 may be a semiconductor material such as silicon (Si), gallium nitride (GaN), or gallium oxide ($Ga_2O_3$). The thickness direction of the semiconductor substrate 10 is defined as z direction. A direction orthogonal to the z direction and parallel to the upper surface 10*b* of the semiconductor substrate 10 is defined as x direction. A direction orthogonal to the z direction and the x direction is defined as y direction.

The semiconductor device 1 further includes a drain electrode 22 covering the lower surface 10*a* of the semiconductor substrate 10, a source electrode 24 covering the upper surface 10*b* of the semiconductor substrate 10, and trench gates 30 provided in the upper layer portion of the semiconductor substrate 10. Each of the trench gates 30 is provided in a trench TR formed in the upper surface 10*b* of the semiconductor substrate 10. Each of the trench gates 30 includes a gate insulating film 32 covering the inner surface of the trench TR and a gate electrode 34 insulated from the semiconductor substrate 10 by the gate insulating film 32. The gate electrode 34 is insulated from the source electrode 24 by an interlayer insulating film. Each of the trench gates 30 extends in the y direction when observed in the z direction orthogonal to the upper surface 10*b* of the semiconductor substrate 10 (hereinafter, referred to as "when the semiconductor substrate 10 is viewed in a plan view"). The trench gates 30 are arranged to be spaced apart from each other in the x direction when the semiconductor substrate 10 is viewed in a plan view.

The semiconductor substrate 10 includes an n+ drain region 12, an n-type drift region 14, a p-type body region 16, and an n+ source region 18. The drain region 12, the drift region 14, the body region 16, and the source region 18 are arranged in this order in the thickness direction of the semiconductor substrate 10. Other semiconductor regions may be interposed among the drain region 12, the drift region 14, the body region 16, and the source region 18.

The drain region 12 is disposed in a lower layer portion of the semiconductor substrate 10 and is provided at a position exposed from the lower surface 10*a* of the semiconductor substrate 10. The drain region 12 is in ohmic contact with the drain electrode 22 covering the lower surface 10*a* of the semiconductor substrate 10.

The drift region 14 is provided between the drain region 12 and the body region 16, and separates the drain region 12 from the body region 16. The concentration of the n-type impurity in the drift region 14 is lower than the concentration of the n-type impurity in the drain region 12. The drift region 14 is in contact with the bottom surface and the lower portion of the side surface of the trench gate 30.

The body region 16 is provided between the drift region 14 and the source region 18, and separates the drift region 14 and the source region 18 from each other. The body region 16 is in contact with the side surface of the trench gate 30. The body region 16 is electrically connected to the source electrode 24 via a body contact region (not shown). The body contact region has a high concentration of p-type impurities at a position exposed from the upper surface of the semiconductor substrate 10.

The source region 18 is provided on the body region 16 at a position exposed from the upper surface 10*b* of the semiconductor substrate 10. The source region 18 is in ohmic contact with the source electrode 24 covering the upper surface 10*b* of the semiconductor substrate 10.

As shown in FIG. 3, the body region 16 between the trench gates 30 adjacent to each other in the x direction has a trunk portion 16A extending along the y direction and branch portions 16B protruding from the trunk portion 16A when the semiconductor substrate 10 is viewed in a plan view. Although FIG. 3 shows the cross-sectional layout of the body region 16, the other semiconductor regions between the trench gates 30 adjacent to each other in the x direction, that is, the upper end portion of the drift region 14 and the source region 18 also have the same cross-sectional layout. Therefore, a part of the semiconductor substrate 10 between the trench gates 30 adjacent to each other in the x direction is configured by the trunk portion and the branch portion. Hereinafter, the trunk portion and the branch portion will be described with reference to the body region 16.

The trunk portion 16A of the body region 16 has a thin plate shape extending along the yz plane. The width W1 of the trunk portion 16A of the body region 16 is measured in the x direction in which the trench gates 30 adjacent to the trunk portion 16A face each other. The width W1 of the trunk portion 16A of the body region 16 is not particularly limited, but may be, for example, 200 nm or less.

Each of the branch portions 16B of the body region 16 protrudes from the side surface of the trunk portion 16A and extends in the thickness direction of the semiconductor substrate 10 from the upper end to the lower end of the trunk portion 16A. The side surface of the trunk portion 16A is parallel to the yz plane. The branch portion 16B of the body region 16 has a rectangular shape in a plan view of the semiconductor substrate 10. Alternatively, the branch portion 16B of the body region 16 may protrude from the side surface of the trunk portion 16A in various forms. The width W2 of the branch portion 16B of the body region 16 is measured in the longitudinal direction of the trunk portion 16A, that is, the y direction. The width W2 of the branch portion 16B of the body region 16 is not particularly limited, but may be, for example, 200 nm or less.

The branch portions 16B are provided on one side surface of the trunk portion 16A of the body region 16, and also provided on the other side surface of the trunk portion 16A of the body region 16. The branch portions 16B provided on each side surface of the trunk portion 16A of the body region 16 are spaced apart from each other in the longitudinal direction of the trunk portion 16A, that is, they direction. The branch portions 16B are periodically arranged along the y direction. As described above, on the side surface of the body region 16, each of the branch portions 16B forms a convex portion, and a concave portion is formed between the branch portions 16B. The branch portions 16B of the body region 16 are configured to intrude into the trench gates 30 adjacent in the x direction. Therefore, all the side surfaces constituting the branch portion 16B of the body region 16 are in contact with the trench gate 30. Thus, the side surface of the body region 16 and the side surface of the trench gate 30 are configured to mesh with each other.

Next, the operation of the semiconductor device 1 will be described. When a positive voltage is applied to the drain electrode 22, the source electrode 24 is grounded, and a voltage equal to or higher than a threshold voltage that is more positive than that of the source electrode 24 is applied to the gate electrode 34 of the trench gate 30, the semiconductor device 1 is turned on. At this time, an inversion layer is formed in a portion of the body region 16 that separates the source region 18 and the drift region 14 and faces the side surface of the trench gate 30. The electrons supplied from the source region 18 reach the drift region 14 via the inversion layer. The electrons that have reached the drift region 14 flow in the vertical direction and flow to the drain region 12. As a result, the drain electrode 22 and the source electrodes 24 become conductive.

When a positive voltage is applied to the drain electrode 22, the source electrode 24 is grounded, and the gate electrode 34 of the trench gate 30 is grounded, an inversion layer is not formed on the side surface of the trench gate 30, and the semiconductor device 1 is off. Thus, the semiconductor device 1 can operate as a switching element.

In the semiconductor device 1, the width W1 of the trunk portion 16A of the body region 16 is relatively small, and the distance between the adjacent trench gates 30 is relatively short. Therefore, in the semiconductor device 1, since a large channel area is secured, the channel resistance is reduced. In the semiconductor device 1, the width W1 of the trunk portion 16A of the body region 16 is 200 nm or less. In this case, when the semiconductor device 1 is turned on, the inversion layers formed on the side surfaces of the trench gates 30 adjacent to the trunk portion 16A in the x direction are connected to each other, and the entire trunk portion 16A can serve as a channel. Therefore, the semiconductor device 1 can have an extremely low channel resistance. The width W1 of the trunk portion 16A of the body region 16 may be 100 nm or less, and may be 80 nm or less. As the width W1 of the trunk portion 16A of the body region 16 is smaller, the channel resistance can be reduced.

Further, in the semiconductor device 1, the width W2 of the branch portion 16B of the body region 16 is also 200 nm or less. Therefore, when the semiconductor device 1 is turned on, the inversion layers formed on the side surfaces of the trench gates 30 adjacent to the branch portion 16B in the y direction are connected to each other, and the entire branch portion 16B can serve as a channel. Therefore, the semiconductor device 1 has an extremely low channel resistance. The width W2 of the branch portion 16B of the body region 16 may be 100 nm or less, and may be 80 nm or less. As the width W2 of the branch portion 16B of the body region 16 is smaller, the channel resistance can be reduced.

Next, some steps of the method of manufacturing the semiconductor device 1 will be described. The other steps that will not be described are not particularly limited, and various techniques including known manufacturing techniques can be used.

Figure 4:
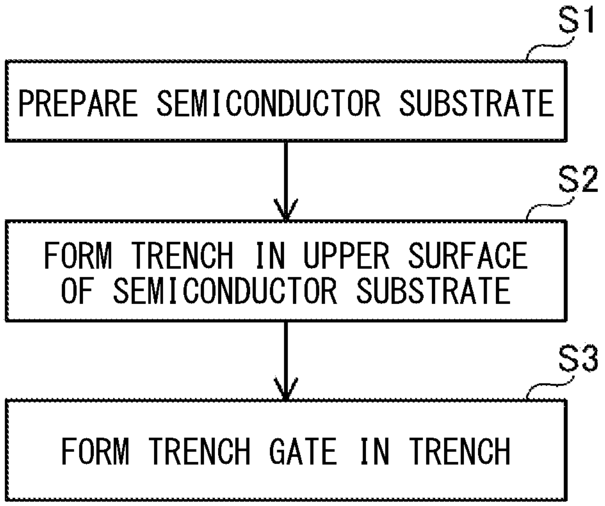
FIG. 4 shows a flow of a method of manufacturing the semiconductor device according to the embodiment.

As shown in FIG. 4, the semiconductor substrate 10 in which the drain region 12, the drift region 14, the body region 16, and the source region 18 are arranged in this order along the depth direction of the semiconductor substrate 10 is prepared (step S1). The semiconductor substrate 10 may be prepared by, for example, growing an n-type layer from the upper surface of the drain region 12 using an epitaxial growth technique, and then implanting p-type impurity ions and n-type impurity ions into a part of the n-type layer from the upper surface 10*b* of the semiconductor substrate 10 using an ion implantation technique to form the body region 16 and the source region 18.

Next, as shown in FIG. 4, after a mask is patterned on the upper surface 10*b* of the semiconductor substrate 10 by using a photolithography technique, a trench TR is formed from the upper surface 10*b* of the semiconductor substrate 10 exposed to the opening of the mask by using an anisotropic dry etching technique to penetrate the source region 18 and the body region 16 and reach the drift region 14 (step S2). Although not particularly limited, the trench TR may be formed in a tapered shape with a taper angle in the range between 87° and 90°.

Figure 5:
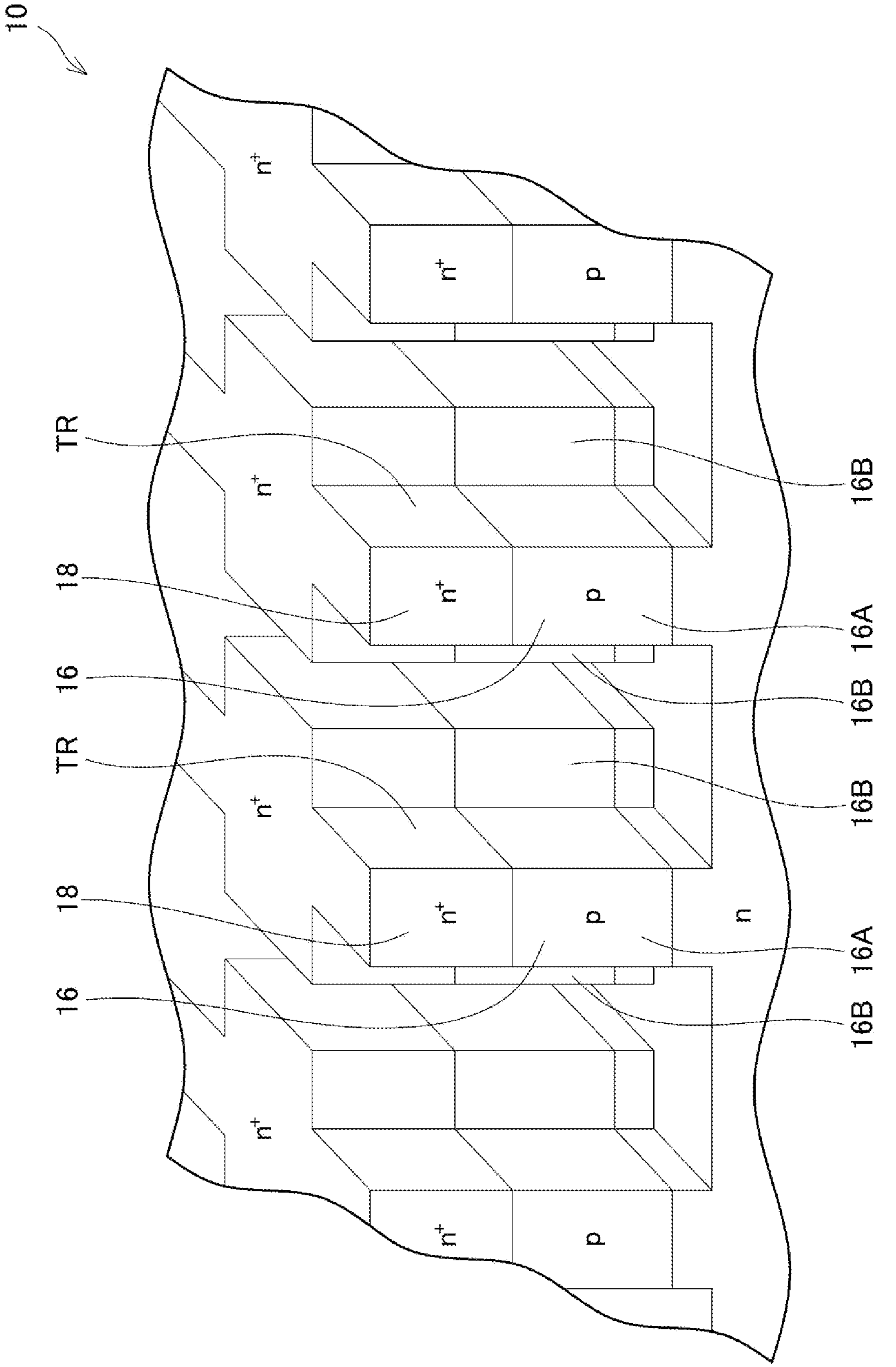
FIG. 5 schematically shows a perspective view illustrating a manufacturing process in the manufacturing method of the semiconductor device of the embodiment.

FIG. 5 is a perspective view of the semiconductor substrate 10 after the trench TR is formed. As shown in FIG. 5, a part of the semiconductor substrate 10 between the adjacent trenches TR is composed of a trunk portion 16A and a branch portion 16B. The branch portion 16B is formed so as to protrude from the side surface of the thin plate-like trunk portion 16A. Therefore, the branch portion 16B can support the trunk portion 16A. If the branch portion 16B is not formed while the trenches TR are formed, a part of the semiconductor substrate 10 between the adjacent trenches TR is formed in a thin plate shape. Thus, there is a concern that a pattern collapse of a part of the semiconductor substrate 10 may occur. In contrast, in this manufacturing method, when the trenches TR are formed in the trench forming step, the branch portion 16B can support the trunk portion 16A, so that pattern collapse of a part of the semiconductor substrate 10 can be suppressed. When the width W1 (see FIG. 3) of the trunk portion 16A becomes 200 nm or less so that the entire trunk portion 16A of the body region 16 becomes a channel, the issue of pattern collapse is to be solved. When the width W1 of the trunk portion 16A is 100 nm or less, and may be 80 nm or less, the issue of pattern collapse is particularly to be solved. This manufacturing method is particularly useful in such a case.

Next, as shown in FIG. 4, the trench gate 30 is formed in the trench TR (step S3). Specifically, the gate insulating film 32 is formed on the upper surface of the semiconductor substrate 10 including the inner surface of the trench TR by using a CVD technique. Next, after a polysilicon layer is formed by using a CVD technique, the polysilicon layer is patterned to form the gate electrode 34. Thus, the trench gate 30 is formed. Next, the interlayer insulating film is patterned so as to cover the gate electrode 34. Finally, by forming the drain electrode 22 and the source electrode 24, the semiconductor device 1 shown in FIGS. 1 to 3 is completed.

Hereinafter, a semiconductor device according to a modification will be described.

Figure 6:
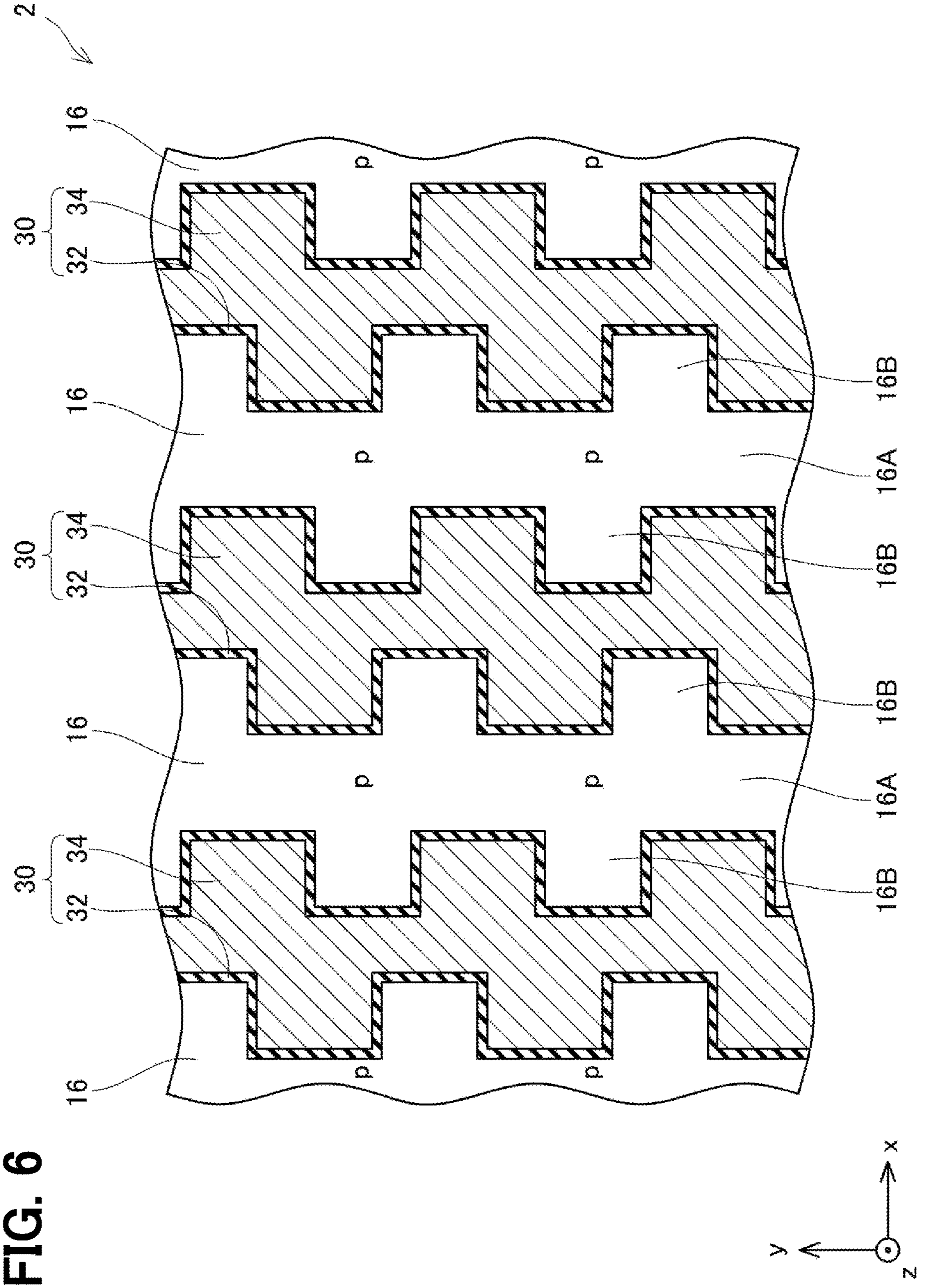
FIG. 6 is a sectional view illustrating a semiconductor device according to a modification of the embodiment, corresponding to a view taken along line III-Ill in FIGS. 1 and 2.

In the semiconductor device 2 shown in FIG. 6, the body regions 16 face each other in the x direction with the trench gate 30 interposed therebetween. A part of the branch portion 16B of one body region 16 faces a part of the branch portion 16B of the other body region 16. For example, in the semiconductor device 1 illustrated in FIG. 3, the entire branch portion 16B of one body region 16 is configured to face the entire branch portion 16B of the other body region 16. Since the trench gate 30 between the branch portions 16B of the opposing body regions 16 becomes a narrow portion, it becomes a factor of increasing the gate resistance. With the configuration of the semiconductor device 2 shown in FIG. 6, the narrowing portion of the trench gate 30 is reduced, so that an increase in gate resistance can be suppressed.

Figure 7:
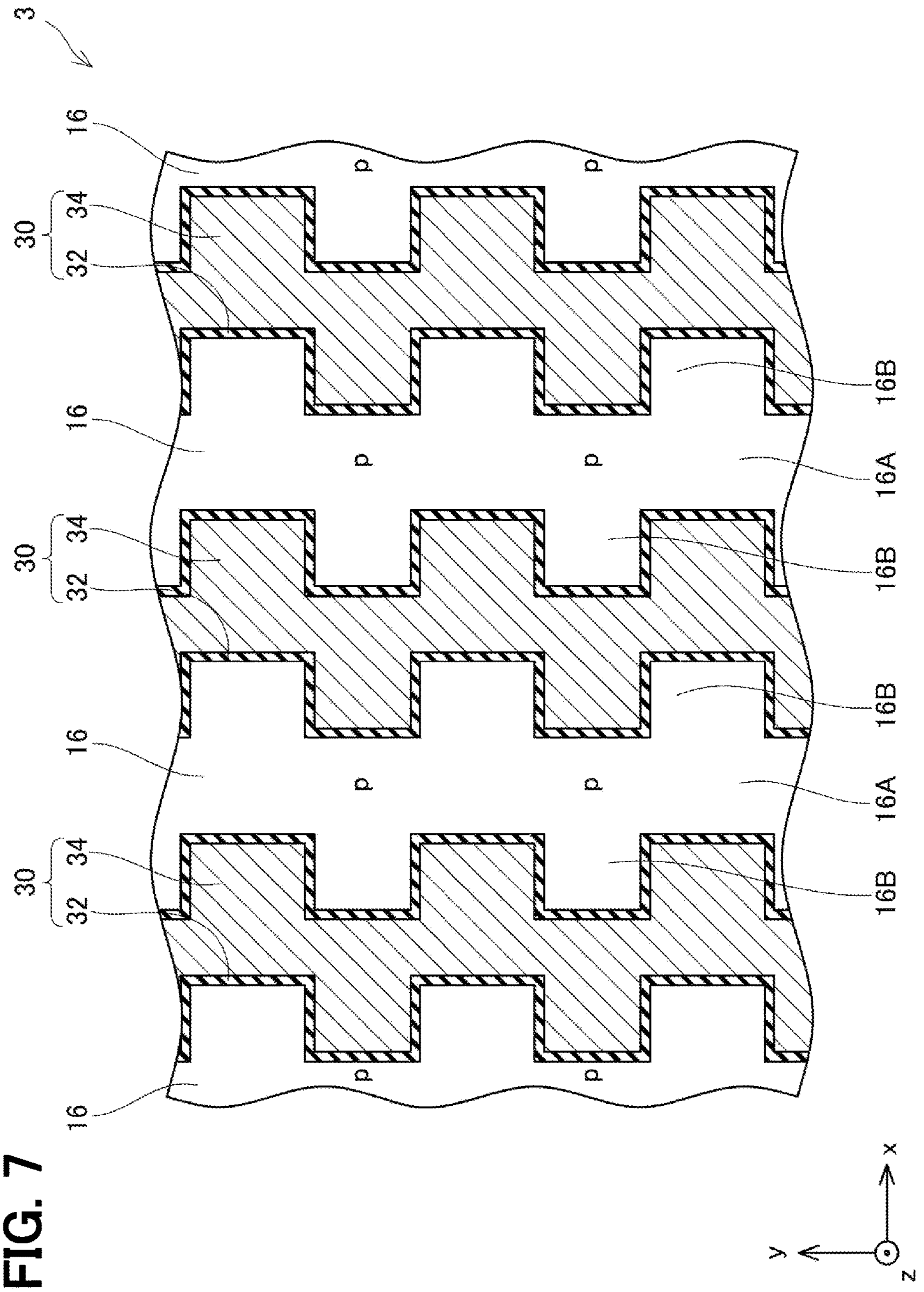
FIG. 7 is a sectional view illustrating a semiconductor device according to a modification of the embodiment, corresponding to a view taken along line III-Ill in FIGS. 1 and 2.
Figure 8:
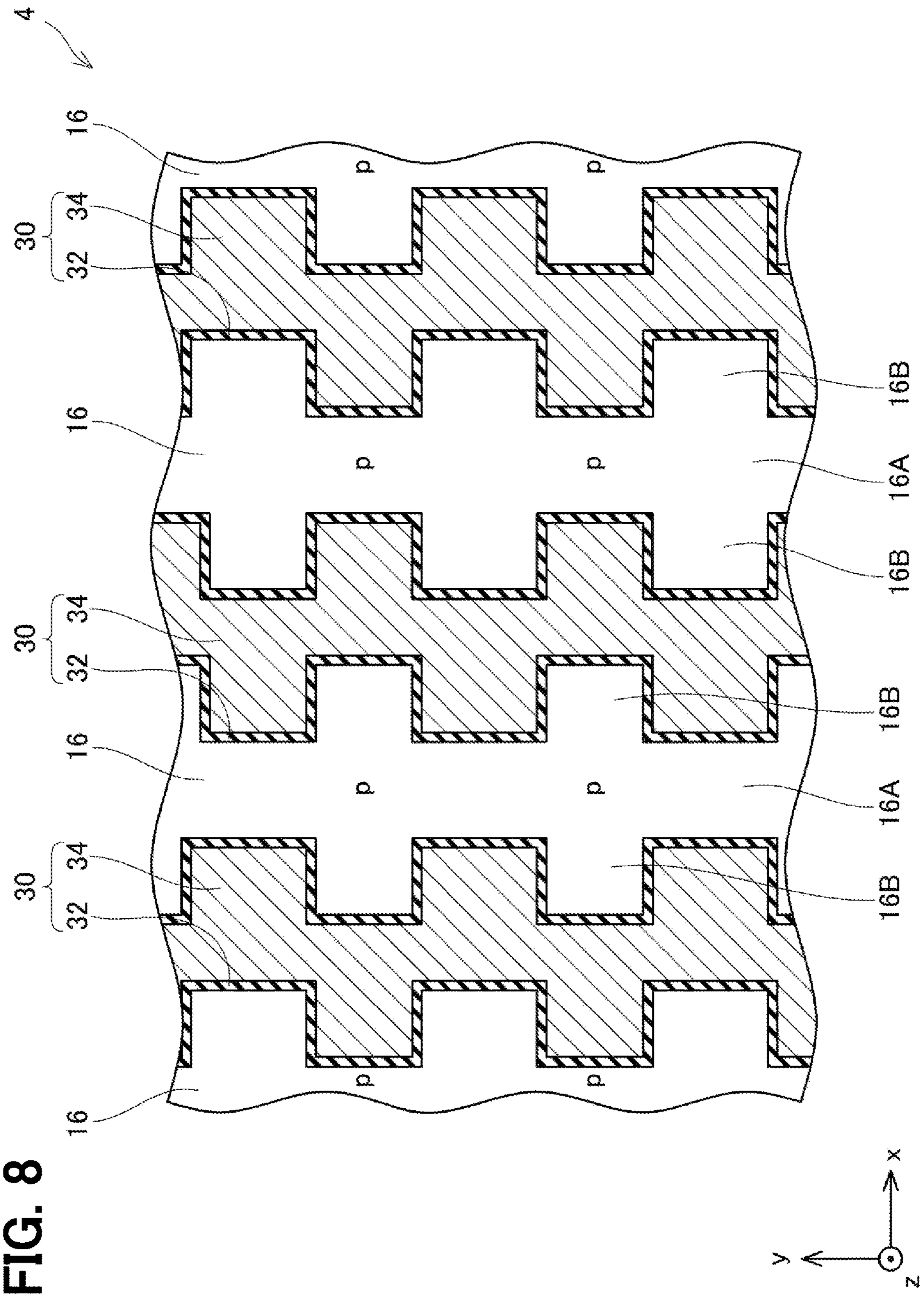
FIG. 8 is a sectional view illustrating a semiconductor device according to a modification of the embodiment, corresponding to a view taken along line III-Ill in FIGS. 1 and 2.

In the semiconductor device 3 illustrated in FIG. 7 and the semiconductor device 4 illustrated in FIG. 8, the body regions 16 face each other in the x direction with the trench gate 30 interposed therebetween. The entire branch portion 16B of one body region 16 is configured to face the trunk portion 16A between the branch portions 16B of the other body region 16. In the semiconductor device 3 shown in FIG. 7, the layouts of the body regions 16 adjacent to each other in the x direction coincide with each other. In the semiconductor device 4 shown in FIG. 8, the layouts of the body regions 16 adjacent to each other in the x direction are displaced in the y direction. In both the semiconductor device 3 illustrated in FIG. 7 and the semiconductor device 4 illustrated in FIG. 8, since the narrowing portion of the trench gate 30 does not substantially exist, an increase in gate resistance can be suppressed.

Figure 9:
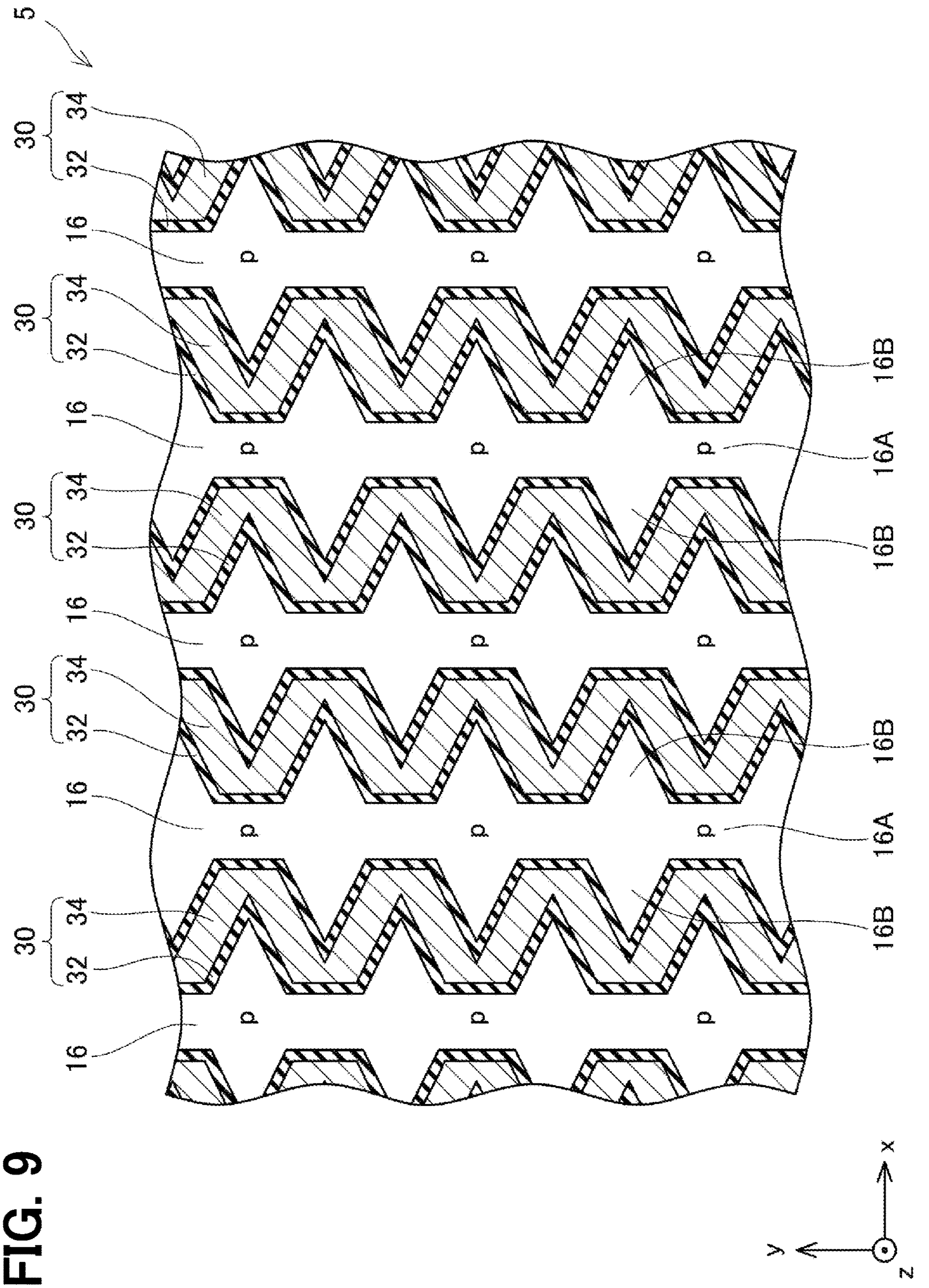
FIG. 9 is a sectional view illustrating a semiconductor device according to a modification of the embodiment, corresponding to a view taken along line III-Ill in FIGS. 1 and 2.

In the semiconductor device 5 illustrated in FIG. 9, the branch portion 16B of the body region 16 has a triangular shape when the semiconductor substrate 10 is viewed in a plan view. Also in this case, pattern collapse during the manufacturing process can be suppressed as in the other embodiments.

Although specific examples of the present disclosure have been described in detail above, these are merely examples and do not limit the scope of the present description. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A semiconductor device comprising:

a semiconductor substrate having a first main surface and a second main surface, wherein a first semiconductor region having a first conductivity type, a second semiconductor region having a second conductivity type, and a third semiconductor region having a first conductivity type are arranged in this order in a thickness direction of the semiconductor substrate, the third semiconductor region being provided at a position exposed from the first main surface; and a plurality of trench gates extended from the first main surface of the semiconductor substrate to reach the first semiconductor region beyond the third semiconductor region and the second semiconductor region, wherein the plurality of trench gates is arranged to be spaced apart from each other in a first direction when the semiconductor substrate is viewed in a plan view, a part of the semiconductor substrate located between the trench gates adjacent to each other in the first direction includes a trunk portion extending in a second direction orthogonal to the first direction and a branch portion protruding from the trunk portion when the semiconductor substrate is viewed in a plan view, and the trunk portion and the branch portion are in direct contact with the trench gates adjacent to each other.

2. The semiconductor device according to claim 1, wherein a width of a region of the trunk portion having the second conductivity type in the first direction is set within a range in which the region of the trunk portion having the second conductivity type entirely becomes a channel such that inversion regions formed on side surfaces of the trench gates adjacent to each other are connected to each other when the semiconductor device is turned on.

3. The semiconductor device according to claim 2, wherein the width of the region of the trunk portion having the second conductivity type in the first direction is 200 nm or less.

4. The semiconductor device according to claim 1, wherein a width of a region of the branch portion having the second conductivity type in the second direction is set within a range in which the region of the branch portion having the second conductivity type entirely becomes a channel such that inversion regions formed on side surfaces of the trench gates adjacent to each other are connected to each other when the semiconductor device is turned on.

5. The semiconductor device according to claim 4, wherein the width of the region of the branch portion having the second conductivity type in the second direction is 200 nm or less.

6. The semiconductor device according to claim 1, wherein the part of the semiconductor substrate located between the trench gates adjacent to each other in the first direction is one of a plurality of parts of the semiconductor substrate located between trench gates of the plurality of trench gates adjacent to each other in the first direction, the trunk portion is one of a plurality of trunk portions, the branch portion is one of a plurality of branch portions, a portion of each branch portion of the plurality of branch portions having the second conductivity type faces a portion of an adjacent trunk portion of the plurality of trunk portions having the second conductivity type in the first direction, and the plurality of trench gates is interposed between the plurality of trunk portions and the plurality of branch portions.

7. A method of manufacturing a semiconductor device comprising:

forming a plurality of trenches on a first main surface of a semiconductor substrate, wherein a first semiconductor region having a first conductivity type, a second semiconductor region having a second conductivity type, and a third semiconductor region having a first conductivity type are arranged in this order in a thickness direction of the semiconductor substrate, the third semiconductor region being provided at a position exposed from the first main surface, each of the trenches being extended from the first main surface of the semiconductor substrate to reach the first semiconductor region beyond the third semiconductor region and the second semiconductor region; and forming a trench gate in each of the plurality of trenches, wherein the trench gate is one of a plurality of trench gates arranged to be spaced apart from each other in a first direction when the semiconductor substrate is viewed in a plan view, a part of the semiconductor substrate between the trench gates adjacent to each other in the first direction includes a trunk portion extending in a second direction orthogonal to the first direction and a branch portion protruding from the trunk portion when the semiconductor substrate is viewed in a plan view, and the trunk portion and the branch portion are in direct contact with the trench gates adjacent to each other.

8. The method according to claim 7, wherein a width of a region of the trunk portion having the second conductivity type in the first direction is set within a range in which the region of the trunk portion having the second conductivity type entirely becomes a channel such that inversion regions formed on side surfaces of the trench gates adjacent to each other are connected to each other when the semiconductor device is turned on.

9. The method according to claim 7, wherein a width of a region of the branch portion having the second conductivity type in the second direction is set within a range in which the region of the branch portion having the second conductivity type entirely becomes a channel such that inversion regions formed on side surfaces of the trench gates adjacent to each other are connected to each other when the semiconductor device is turned on.

10. The semiconductor device according to claim 1, wherein the trunk portion and the branch portion are formed in the second semiconductor region located between the trench gates adjacent to each other in the first direction.

11. The semiconductor device according to claim 1, wherein the trunk portion and the branch portion are formed in the third semiconductor region located between the trench gates adjacent to each other in the first direction.

12. The semiconductor device according to claim 1, wherein the branch portion is configured to protrude into a trench gate of the plurality of trench gates such that all side surfaces of the branch portion are in contact with the trench gate of the plurality of trench gates.

13. The semiconductor device according to claim 1, wherein the trunk portion is one of a plurality of trunk portions, the branch portion is one of a plurality of branch portions, and each of the plurality of trench gates is interposed between one of the plurality of trunk portions and one of the plurality of branch portions.

14. The method according to claim 7, wherein the trunk portion and the branch portion are formed in the second semiconductor region located between the trench gates adjacent to each other in the first direction.

15. The method according to claim 7, wherein the trunk portion and the branch portion are formed in the third semiconductor region located between the trench gates adjacent to each other in the first direction.

16. The method according to claim 7, wherein the branch portion is configured to protrude into a trench gate of the plurality of trench gates such that all side surfaces of the branch portion are in contact with the trench gate of the plurality of trench gates.

17. The method according to claim 7, wherein the trunk portion is one of a plurality of trunk portions, the branch portion is one of a plurality of branch portions, and each of the plurality of trench gates is interposed between one of the plurality of trunk portions and one of the plurality of branch portions.

* * * * *